United States Patent
Thomas

(10) Patent No.: US 9,208,963 B2
(45) Date of Patent: Dec. 8, 2015

(54) SAFETY DOOR SWITCH APPARATUS

(71) Applicant: Toyota Motor Engineering & Manufacturing North America, Inc, Erlanger, KY (US)

(72) Inventor: Eric N Thomas, Florence, KY (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 118 days.

(21) Appl. No.: 14/175,826

(22) Filed: Feb. 7, 2014

(65) Prior Publication Data
US 2015/0228421 A1    Aug. 13, 2015

(51) Int. Cl.
*H01H 13/08*    (2006.01)
*H01H 9/22*    (2006.01)
*H01H 3/02*    (2006.01)
*H03K 17/945*    (2006.01)

(52) U.S. Cl.
CPC ............... *H01H 9/226* (2013.01); *H01H 3/022* (2013.01); *H03K 17/945* (2013.01); *H01H 2003/0233* (2013.01)

(58) Field of Classification Search
CPC . E05B 65/06; E05B 65/1013; E05B 65/1053; E05B 65/1093; H01H 9/22
USPC .......................................... 200/334; 292/150
See application file for complete search history.

(56) References Cited

U.S. PATENT DOCUMENTS

| | | | |
|---|---|---|---|
| 1,842,453 A | 1/1932 | Jenkins | |
| 4,529,234 A * | 7/1985 | Senften | 292/169.15 |
| 4,902,053 A * | 2/1990 | Hakkarainen et al. | 292/144 |
| 5,029,912 A * | 7/1991 | Gotanda | 292/143 |
| 7,775,072 B2 | 8/2010 | Pullmann et al. | |
| 2004/0159134 A1 * | 8/2004 | Eichenauer | 70/278.1 |
| 2005/0012343 A1 * | 1/2005 | Warden et al. | 292/144 |

FOREIGN PATENT DOCUMENTS

EP    1 274 107 B1    5/2012
EP    1 826 472 B1    4/2013

OTHER PUBLICATIONS

ABB Jakob Safety, "Original Instructions Knox Safety and process lock" Rev. D, published Aug. 12, 2013, Sweden in 27 pages.

* cited by examiner

*Primary Examiner* — Renee Luebke
*Assistant Examiner* — Ahmed Saeed
(74) *Attorney, Agent, or Firm* — Christopher G. Darrow; Darrow Mustafa PC

(57) ABSTRACT

An apparatus generates a machine operation enable signal as a function of a closed position of a movable safety access door of a safety guard for a work cell. A pivotal plate carries a handle and a switch receiver. A stationary non-contact proximity switch is mounted to be activated by the switch receiver when the door is closed and the pivotal plate is in a latched position. A ring receives a tongue projecting from the pivotal plate when the plate and handle are in the latched position. A pivotal hasp is movable around the ring into interference with the path of movement of the pivotal plate to block the plate from the fully latched position. A movable detent enables the plate and handle to be moved to the fully latched position only by moving the detent from exterior side of the plate.

9 Claims, 6 Drawing Sheets

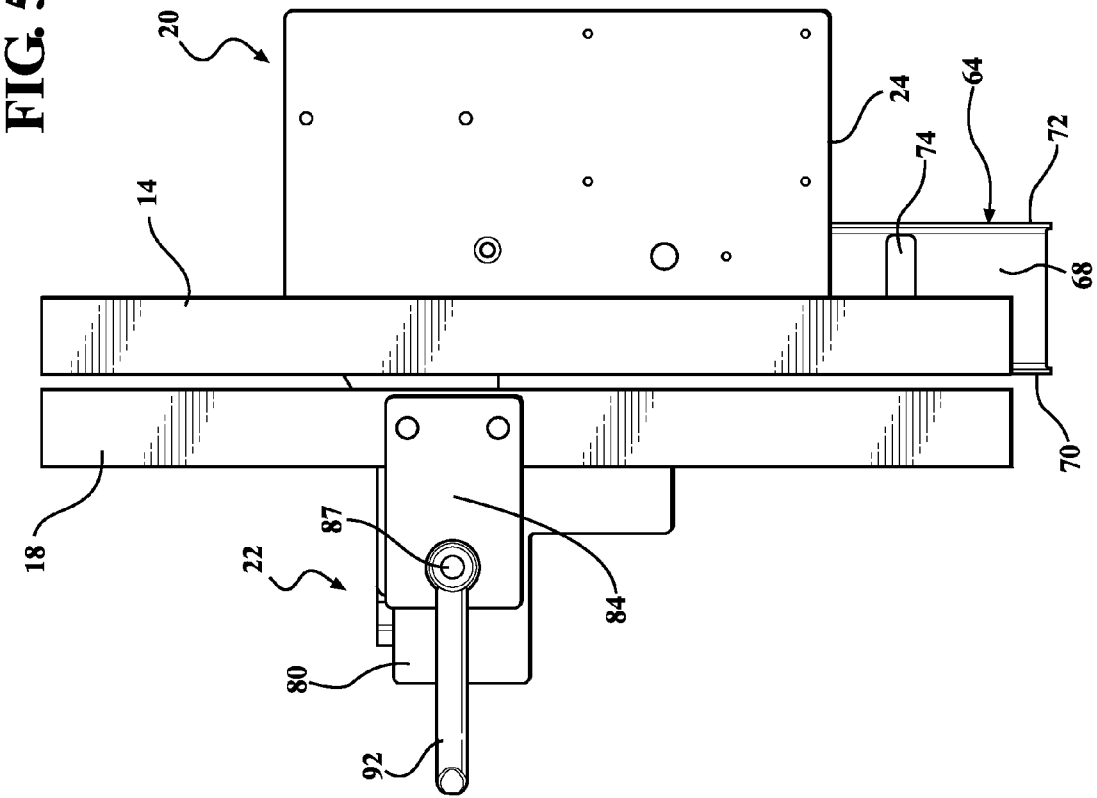
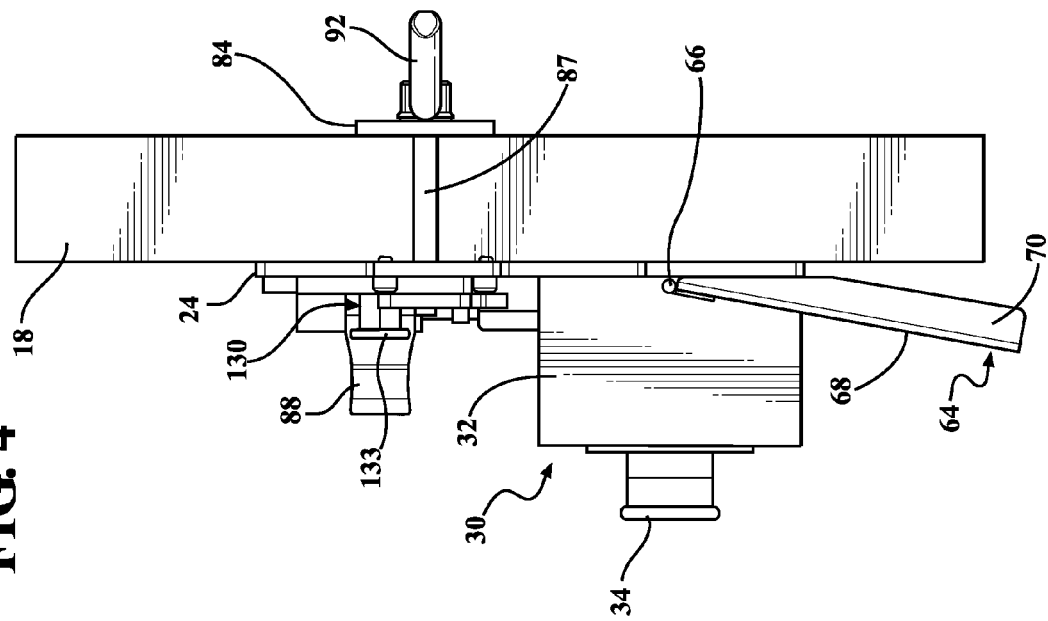

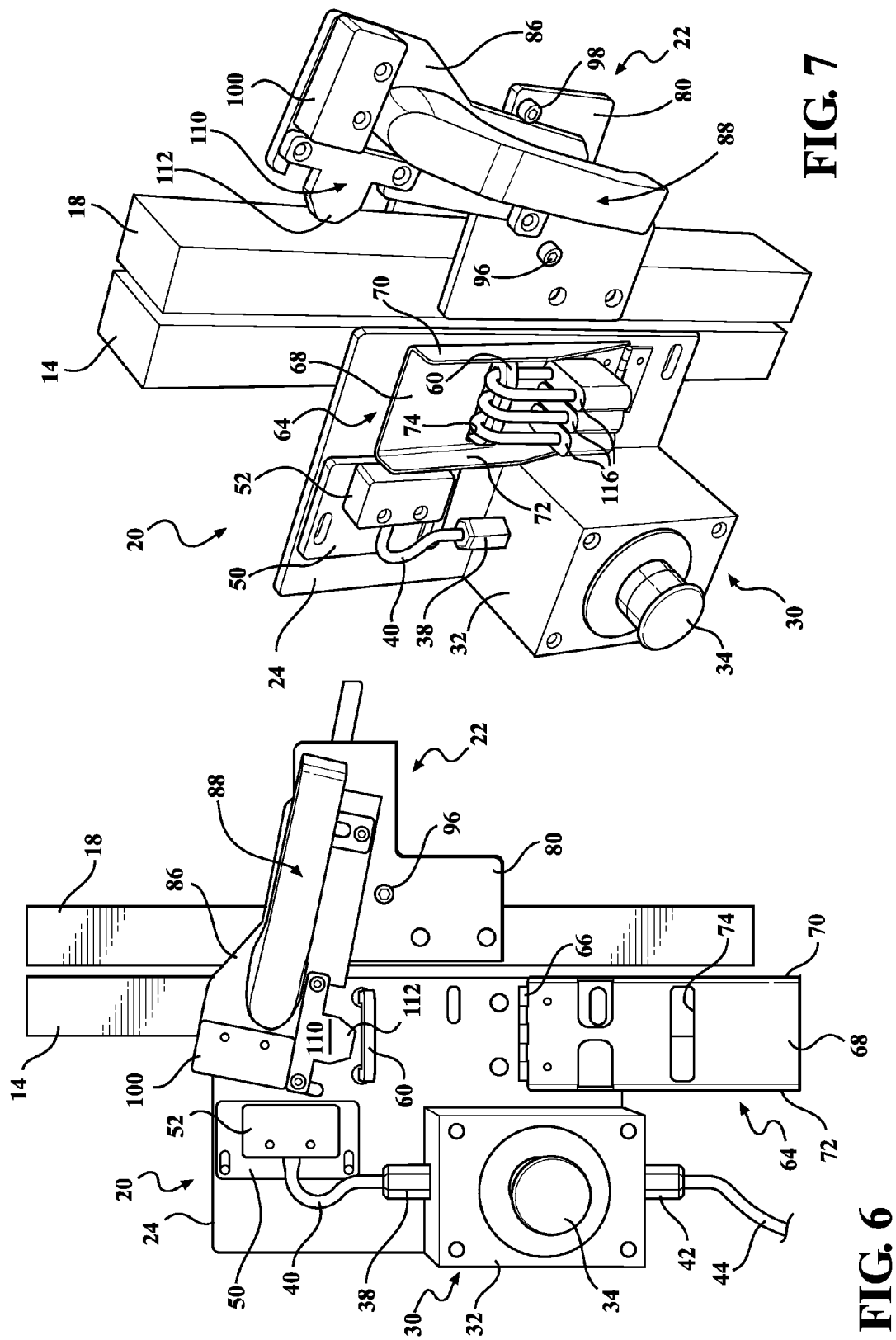

SAFETY DOOR SWITCH APPARATUS

BACKGROUND

The present disclosure relates, in general, to safety door switch apparatus.

Manufacturing facilities utilize numerous automatic equipment, programmed robots, etc., to perform manufacturing tasks. This equipment poses a significant hazard to nearby workers or maintenance personnel, particularly if the equipment begins operation when a worker is performing maintenance on or working or otherwise located in proximity to the equipment.

Some manufacturing equipment is divided into work cells covering a predetermined length of a manufacturing assembly line or as stand-alone equipment. Access to the work cell can be controlled by means of a stationary fence or barrier and a sliding or swinging door which allows access to the equipment within the work cell. Such safety doors are normally latched in a closed position. Safety switches mounted on the door and the adjacent stationary fence or barrier provide a signal to the machine control that the door is closed. This signal is required in order to operate the machinery in the work cell. When a worker needs to access the machinery, they open the door which discontinues the signal to the machine control thereby deactivating the machinery for the safety of the worker.

Prior safety switch apparatus prevent the closing and re-latching of the door to the fence when a worker is inside of the work cell by preventing a pivotal handle carrying part of the switch apparatus from advancing into the normal door closed and handle latched position. Manually operated padlocks carried by the workers can be inserted into the safety apparatus to prevent the door handle from being latching in the closed position which would cause the machinery to reactive while the worker is still in the work cell.

However, the available safety door switch apparatuses require special components which makes it difficult to obtain such safety door switch apparatus in a timely manner when needed in a manufacturing facility. It would be desirable to provide a safety door switch apparatus made from simple and easy to make and procure components, and including simple mechanical bracketing.

SUMMARY

The safety door switch apparatus for generating an enable signal as a function of a position of a movable safety access door of a safety barrier for a work cell having a stationary frame disposed in proximity to the safety access door when the door is in a closed position, a first mounting bracket mounted on the safety access door, a plate pivotally mounted on the mounting bracket on the safety access door, a handle fixedly mounted on the plate, a second mounting bracket mounted on a stationary frame, a proximity switch mounted on the plate, and a switch receiver carried on the second mounting plate and adapted to be disposed in proximity with the switch when the door is in the closed position to activate the switch receiver.

The safety switch apparatus of the switch receiver is mounted adjacent an end of the plate when the door is in a closed position.

An emergency stop push button is mounted on second mounting plate.

A ring having an interior aperture is mounted on the second mounting bracket. A tongue mounted on the plate on the door is adapted to be slidably inserted into the interior aperture of the eye when the door is in the closed position and the pivotal plate is in a latched position. A hasp is pivotally mounted on the second mounting, the hasp having an aperture. The hasp is movable between a first position spaced from a ring on the mounting plate to enable the ring to receive the tongue on the second mounting bracket, and a second position wherein the slot in the hasp surrounds the ring disposing the hasp in an interference position with respect to a path of movement of the pivotal bracket on the door to the closed position preventing actuation of the switch receiver.

A third bracket is affixed to the door on an interior side of the door. An inside handle is rotatably carried on the second bracket.

A rotatable shaft is connected between the inside handle and the handle on the plate. The rotatable shaft defines a pivot axis of the plate and the handle A portion of the ring is accessible exteriorly of the hasp, when the hasp is in the second position, to allow a lockable padlock to be mounted over the ring to prevent the hasp from pivoting to the first position.

BRIEF DESCRIPTION OF THE DRAWING

The various features, advantages and other uses of the present safety door switch apparatus will become more apparent by referring to the further detailed description and drawing in which:

FIG. 4 is a right side view of the safety door switch apparatus shown in FIG. 1;

FIG. 5 is a rear elevation view of the safety door switch apparatus shown in FIG. 1;

FIG. 6 is a front elevation view showing the door latch handle in an intermediate detent position;

FIG. 7 is a perspective view of the safety door switch apparatus shown in FIG. 1, but depicted in a door handle opened and locked from closing position.

DETAIL DESCRIPTION OF THE DRAWING

Figure 1:
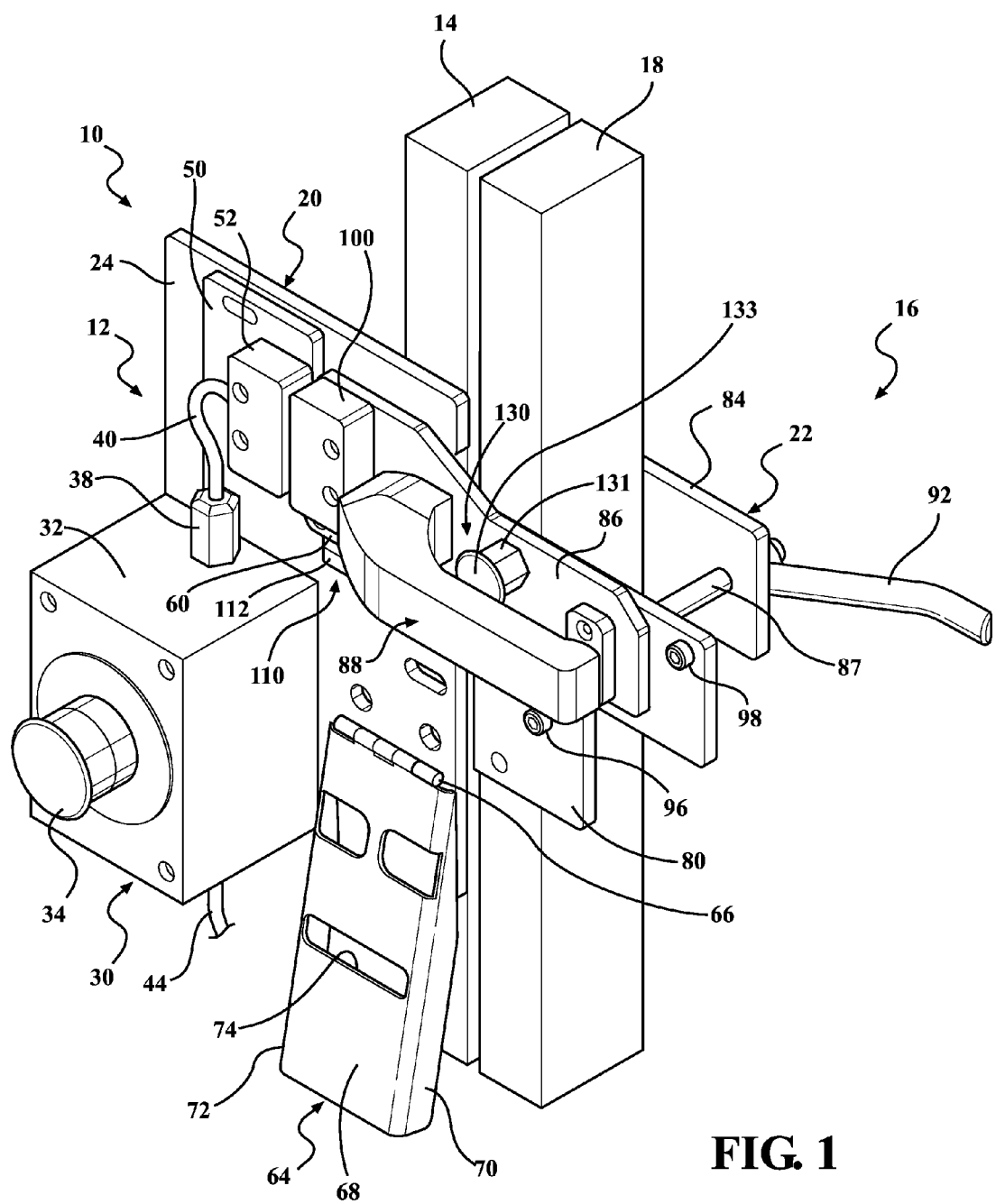
FIG. 1 is a perspective view of a safety door switch apparatus shown in a latched door closed, handle latched position.

Referring now to the drawing, and to FIGS. 1-8 in particular, there is depicted a safety door switch apparatus 10 used to control access to a work cell, such as a work cell in a manufacturing facility containing automatic equipment or machinery.

Such work cells include a stationary barrier or fence 12, typically formed of mesh, interwove metal rods which are connected to a stationary vertical frame or post 14 at the location of an opening to the work cell. A right hand or left hand hinge swingable or sliding door 16, partially shown in FIG. 1, also includes a barrier which can be formed of mesh, interwoven steel rods attached at one end to a door post 18. The door 16 is slid or swung to an open position allowing access to the interior of the work cell.

The safety door switch apparatus 10 is mounted on the stationary frame or post 14 and the movable door post 18. The safety door switch apparatus 10 is formed of a two-part assembly including a stationary fence mounted sub-assembly 20 and a door mounted subassembly 22.

The stationary fence mounted sub-assembly 20 includes a second mounting plate 24 which is fixed by bolts or other suitable fasteners to the stationary frame or post 14. An emergency or E-stop assembly 30 is attached to the second mounting plate 24 by suitable fasteners. The E-stop assembly includes a housing 32 on which is mounted a depressible emergency stop palm or push button 34. The E-stop button 34 is coupled to a normally closed switch assembly 36, shown in FIG. 8, which will be described in detail hereafter.

A first cable connector 38 is mounted on the E-stop housing 32 for coupling a cable 40 from a door safety switch, described hereafter, to the switch circuitry within the E-stop housing 32. A second connector 42 is also mounted on the E-stop housing 32 and provides coupling to a second cable 44 which carries the door safety switch signals and the E-stop signals to a machine control 46, shown in FIG. 8.

A smaller mounting plate 50 is attached, by suitable fastening means, to the second mounting plate 24. The mounting plate 50 receives a non-contact switch receiver 52, described hereafter.

A ring 60 is attached by fasteners to the mounting plate 24 adjacent to the mounting plate 50. The ring 60 defines an interior aperture.

A hasp 64 is formed of an inverted U-shaped member having a pair of parallel sidewalls 70 and 72 which depend from opposite sides of a flat central wall 68. A laterally extending slot 74 is formed in the central wall 68 and is sized to fit over the ring 60 when the hasp 64 is moved to the lockable position.

Figure 2:
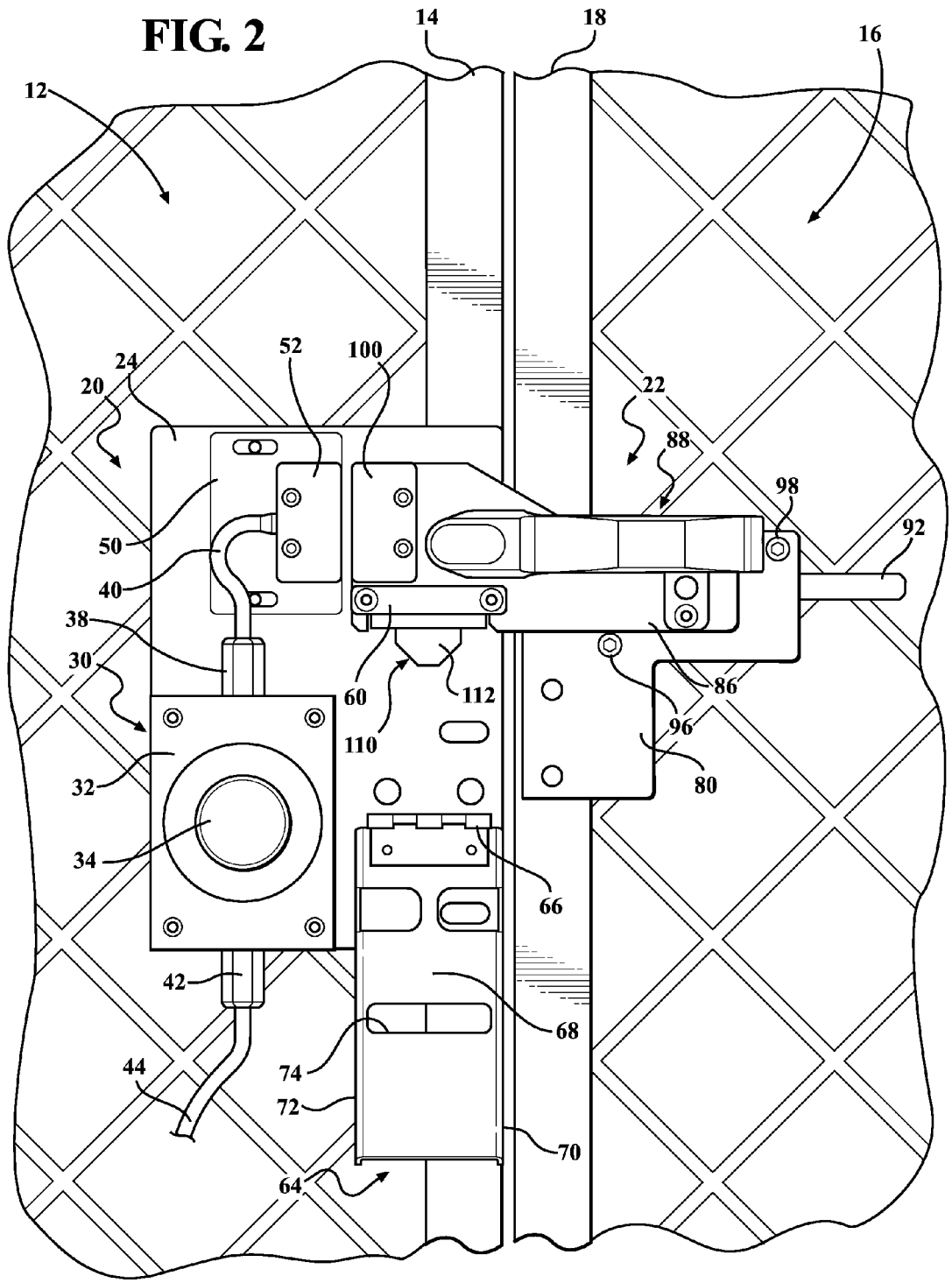
FIG. 2 is a front elevation view of the safety door switch apparatus shown in FIG. 1.
Figure 3:
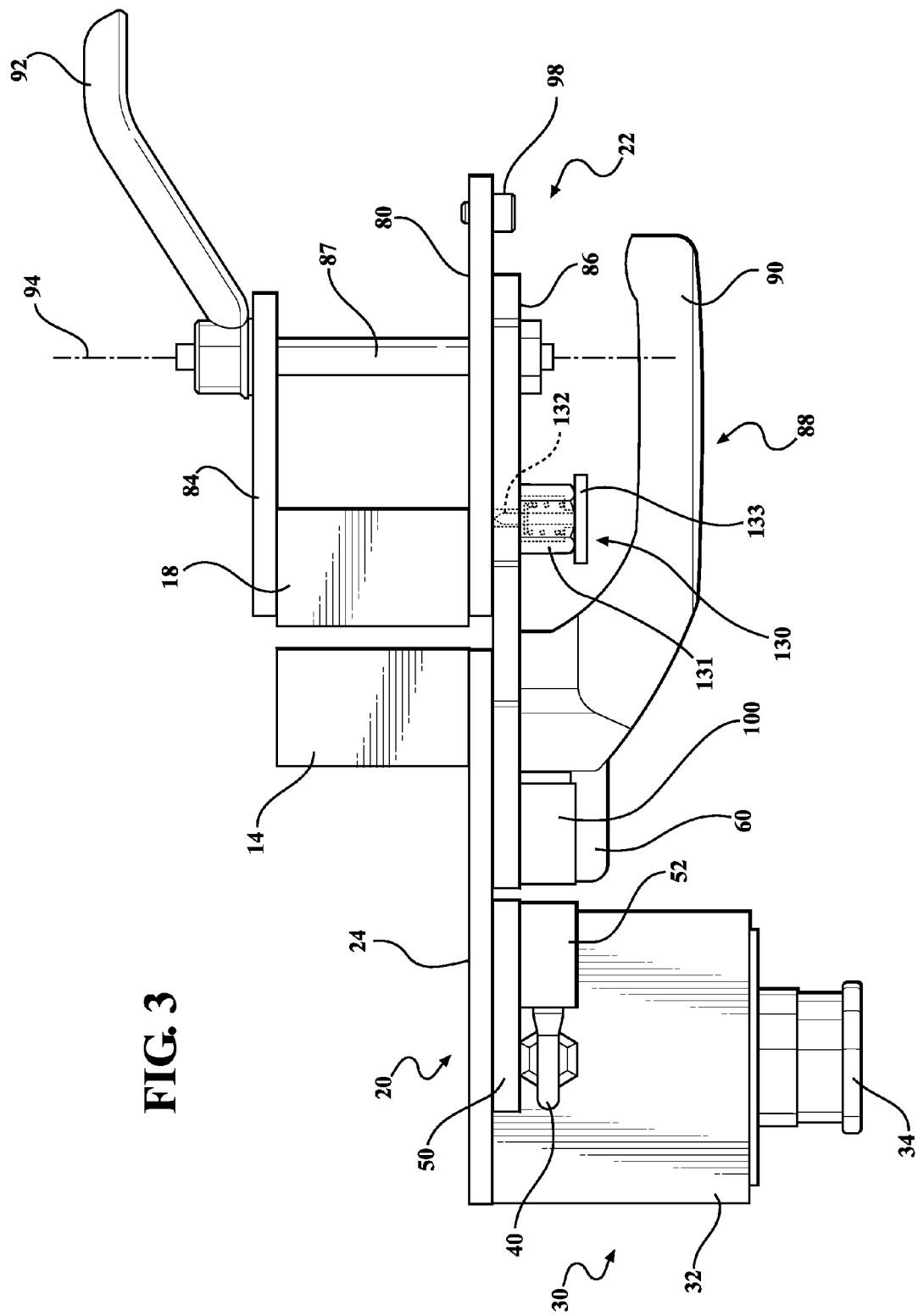
FIG. 3 is a plan view of the safety door switch apparatus shown in FIGS. 1 and 2.
Figure 8:
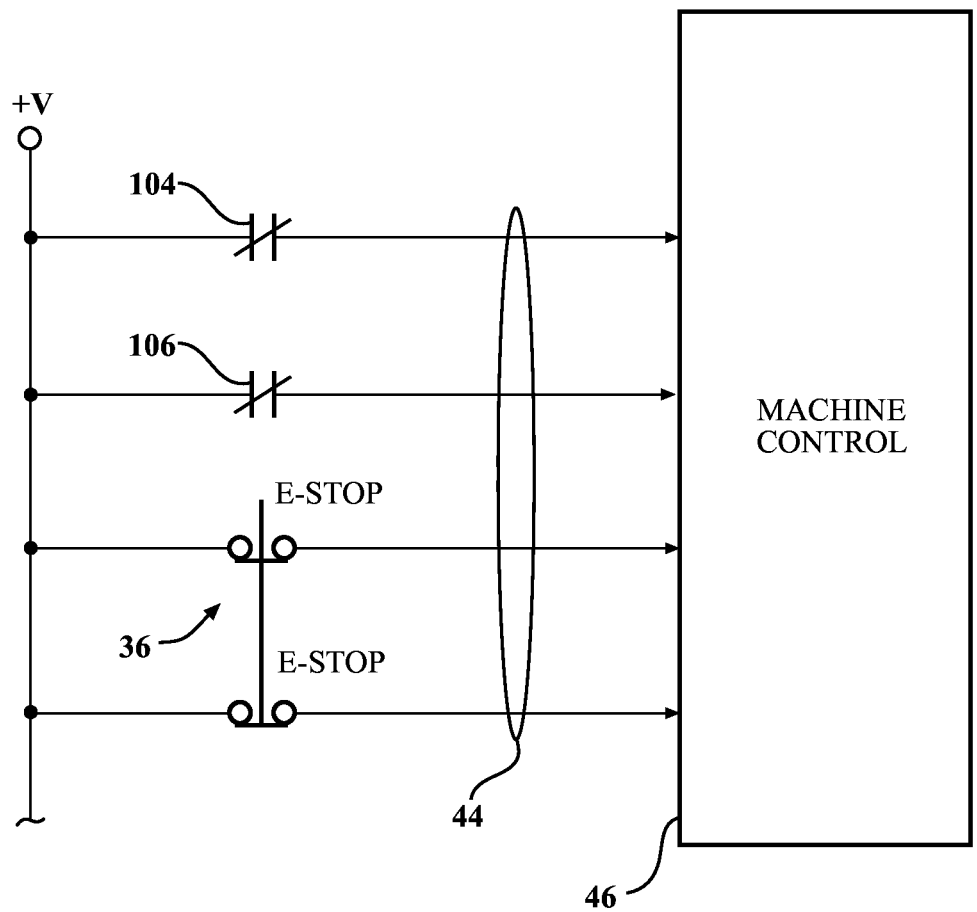
FIG. 8 is a partial schematic diagram showing the connections between the safety door switch contacts, the E-stop push button and the cable used to transfer door and handle position signals to a machine control.

The hasp 64 is pivotally mounted by means of a hinge 66 to the mounting plate 24 and is pivotally movable about the axis of the hinge 66 between a first, normal position shown in FIGS. 1 and 2 where the hasp 64 generally projects downward from the mounting plate 24 to a raised position shown in FIG. 7 where the slot 74 is slidable over the ring 60.

The door mounted subassembly 22 includes a first mounting plate 80 having a generally L-shape fixedly mounted by suitable fasteners to the exterior surface of the door post 18, relative to the inside of the work cell. A third mounting plate 84 is fixed by suitable fasteners to the interior side of the door post 18, again relative to the interior of the work cell. A rotatable shaft 87 extends through the mounting plates 80 and 84 and is fixedly coupled to an exterior plate 86 which has an elongated shape to span portions of the first and second subassemblies 20 and 22, when in the door 16 is in a closed position as shown in FIG. 1.

An exterior handle 88 is fixedly mounted to the exterior plate 86 and has a grip portion 90 spaced from the exterior plate 86. An interior handle 92 is fixed to the shaft 87. The shaft 87 defines a pivot axis 94 for the interior handle 92 and the exterior handle 88 as well as the exterior plate 86 on which the exterior handle 88 is mounted. A pair of position limit stops 96 and 98 are mounted on the second mounting plate 80 to define the door closed handle and latched position of the exterior plate 86 and the exterior handle 88, and an unlatched pivoted position of the exterior handle 88 and exterior plate 86.

A non-contact switch 52, sold by STI, is carried by a plate 50 attached to the second mounting plate 24. A matching non-contact switch receiver 100 is mounted on one end of the exterior plate 86. When the exterior plate 86 and the exterior handle 88 are in the door closed, handle latching position, the switch receiver 100 is located in close proximity to the non-contact switch 52 thereby activating the non-content switch 52 to close a pair of redundant contacts 104 and 106, shown in FIG. 8, indicating that the door 16 is in a closed position relative to the stationary fence 12 and, also, that exterior handle 88 is in the latched position.

This position of the exterior handle 88 and the door 16 defines a machine ready state which indicates that no workers are within the work cell and it is safe to operate the machinery in the work cell. Any other position of the exterior handle 88 will cause the non-contact switch 100 to open the contacts 104 and 106 thereby removing the activation signal to the machine control 46 and deactivate the machine in the work cell.

A bracket 110 is mounted on the exterior mounting plate 86 below the non-contact switch receiver 100. The bracket 110 includes a tongue 112 which is sized to fit within an aperture in the ring 60 when the exterior handle 88 and the exterior plate 86 are in the door closed, handle latched position shown in FIG. 1. In this position, the exterior handle 86 blocks pivotal movement of the hasp 64 to the second position where the slot 74 in the hasp 64 can move over the ring 60 on the second mounting plate 24.

In use, during machine operation, the door 16 will be in a closed position shown in FIG. 1. At this time, the exterior handle 88 and the plate 86 are in the first, door closed, handle latched position where the tongue 112 is inserted through the aperture in the ring 60. The proximity of the non-contact switch receiver 100 on the exterior plate 86 to the switch 52 on the second mounting plate 24 causes the contacts 104 and 106 to close thereby sending signals to the machine control 46 allowing operation of the machine in the work cell.

When a worker desires to enter the work cell to inspect or perform maintenance on the machine in the work cell, the worker grasps the exterior handle 86 and pivots the exterior handle 88 and exterior plate 86 about the pivot axis 94 to the door opened position shown in FIG. 7. This movement moves the switch receiver 100 away from the switch 52 causing the switch 52 to open the contacts 104 and 106 thereby removing the machine activation signal to the machine control 46. The machine control 46 maintains the machine in the work cell in a deactivated, non-operative state as long as the worker is in the work cell, within the stationary fence 12 and door 16.

Next, the worker pivots the hasp 64 about the hinge 66 bringing the slot 74 in the hasp 64 over the ring 60. The worker then places a safety lock 116 over the ring 60 to lock the hasp 64 in the raised position shown in FIG. 7. The ring 60 is sized to allow multiple locks placed by multiple workers. In this position, the end of the hasp 64 is in the path of movement of the exterior plate 86 coupled to the exterior handle 88 thereby preventing the exterior plate 86 and the exterior handle 88 from being moved back to the fully latched first position preventing the switch receiver 100 on the exterior plate 86 from moving into proximity to the switch 52. By this method, the worker establishes individual control, thereby preventing machine operation while performing maintenance on, working on, or otherwise located in proximity to the equipment.

The interior handle 92 may be used by the worker to pivot or slide the door 16 between opened and closed positions as well as moving the entire exterior handle 88 and the plate 86 to the fully opened, unlatched position shown in FIG. 7 to allow the worker to exit the work cell.

As shown in FIG. 6, the safety door switch apparatus 10 has a detent position which prevents the exterior plate 86 and the exterior handle 88 from closing to the latched position unless purposeful action is taken by the worker.

A movable knob and pin assembly 130 is carried by the plate 86. The assembly 130 has a body 131 fixed to the exterior plate 86. A movable knob 133 carries a pin 132 which is extendable from an inner end of the body 131 through a bore in the exterior plate 86. A biasing means, such as a coil spring, is disposed interiorly between the knob 133 and the body 131, to normally bias the knob 133 toward the exterior plate 86 and to bias the pin 132 through the exterior plate 86 toward the mounting plate 80.

When the exterior handle 88 and the exterior plate 86 are in the open position, the pin 132 will be biased outward from the exterior plate 86. As the handle 88 is pivoted toward the latched position, after the hasp 86 has been unlocked and pivoted to the first or downward extending position shown in FIG. 6, the pin 132 will strike an upper edge of the mounting plate 80 and prevent the exterior handle 88 and the exterior plate 86 from further movement to the fully latched position unless the knob 133 is grasped and pulled away from the plate 86. This position defines the detent position of the handle 88.

Pulling the knob 133 retracts the pin 132 from its interference position with the upper edge of the mounting plate 80 and allows the exterior handle 88 and the exterior plate 86 to move from the detent position shown in FIG. 6 into the fully latched position shown in FIG. 1.

This detent feature prevents closure of the handle 88 from inside the work cell. The pin 132 cannot be released from its interference position engaged with the upper edge of the mounting plate 80 except by pulling of the knob 133 from the exterior of the work cell. However, moving the exterior handle 88 and the exterior plate 86 to the open position from inside the cell is still possible via rotation of the handle 92. This detent feature also prevents accidental closure of the exterior handle 88 and the exterior plate 86 from the open position due to gravity.

What is claimed is:

1. A safety switch apparatus for generating an enable signal as a function of a position of a movable safety access door of a safety barrier for a work cell having a stationary frame disposed in proximity to the safety access door when the door is in a closed position, comprising:
    a first mounting bracket mounted on a safety access door;
    a plate pivotally mounted on the first mounting bracket on the safety access door;
    a handle fixedly mounted on the plate;
    a second mounting bracket mounted on a stationary frame;
    a proximity switch mounted on the plate;
    a switch receiver carried on the second mounting bracket and adapted to be disposed in proximity with the proximity switch when the safety access door is in the closed position to activate the switch receiver
    a ring having an interior aperture mounted on the second mounting bracket;
    a tongue extending from the plate on the door adapted to be slidably inserted into the interior aperture of the ring when the door is in the closed position and the plate is in a latched position; and
    a hasp pivotally mounted on the second mounting bracket, the hasp having an aperture, the hasp movable between a first position spaced from the ring to enable the ring to receive the tongue on the second mounting bracket and a second position wherein the aperture in the hasp surrounds the ring disposing the hasp in an interference position with respect to a path of movement of the pivotal plate on the door to the closed position preventing actuation of the switch receiver.

2. The safety switch apparatus of claim 1 wherein:
    the switch receiver is mounted adjacent an end of the plate when the door is in a closed position.

3. The safety switch apparatus of claim 1 further comprising:
    an emergency stop push button mounted on second mounting plate.

4. The safety switch apparatus of claim 1 further comprising:
    a portion of the aperture in the ring being accessible exteriorly of the hasp to allow a padlock to be mounted over the ring to prevent the hasp from pivotal movement to a handle latched position.

5. The safety switch apparatus of claim 1 further comprising:
    a third bracket affixed to the door on an interior side of the door;
    an inside handle rotatably carried on the third bracket.

6. The safety switch apparatus of claim 5 further comprising:
    a rotatable shaft connected between the inside handle and the handle on the plate.

7. The safety switch apparatus of claim 6 wherein:
    the rotatable shaft defines a pivot axis of the plate and the handle on the plate.

8. The safety switch apparatus of claim 1 further comprising:
    a pin retractably projecting from the plate when the plate is in the open position, the pin defining a detent position of the plate preventing any movement of the plate to a handle latched position.

9. The safety switch apparatus of claim 8 further comprising:
    a knob carried exteriorly of the plate, the pin coupled to the knob; and
    a biasing spring coupled to the pin and the knob allowing retraction of the pin by retraction of the knob relative to the plate, and allowing movement of the plate from the detent position to the handle latched position.

\* \* \* \* \*